(12) United States Patent
Fang et al.

(10) Patent No.: US 10,262,942 B2
(45) Date of Patent: Apr. 16, 2019

(54) METHOD OF FORMING COBALT CONTACT MODULE AND COBALT CONTACT MODULE FORMED THEREBY

(71) Applicant: GLOBALFOUNDRIES INC., Grand Cayman (KY)

(72) Inventors: Qiang Fang, Ballston Lake, NY (US); Haigou Huang, Rexford, NY (US); Shafaat Ahmed, Ballston Lake, NY (US); Changhong Wu, Rexford, NY (US); Dinesh R. Koli, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 91 days.

(21) Appl. No.: 15/661,029

(22) Filed: Jul. 27, 2017

(65) Prior Publication Data

US 2019/0035739 A1   Jan. 31, 2019

(51) Int. Cl.

| H01L 21/4763 | (2006.01) |
|---|---|
| H01L 23/12 | (2006.01) |
| H01L 23/532 | (2006.01) |
| H01L 21/768 | (2006.01) |
| H01L 21/288 | (2006.01) |
| H01L 21/285 | (2006.01) |
| H01L 21/3213 | (2006.01) |

(52) U.S. Cl.
CPC ...... *H01L 23/53209* (2013.01); *H01L 21/288* (2013.01); *H01L 21/2855* (2013.01); *H01L 21/32136* (2013.01); *H01L 21/7684* (2013.01); *H01L 21/76846* (2013.01); *H01L 21/76847* (2013.01); *H01L 21/76877* (2013.01)

(58) Field of Classification Search
CPC ........... H01L 23/53209; H01L 21/2855; H01L 21/288; H01L 21/32136; H01L 21/7684; H01L 21/76846; H01L 21/76847; H01L 21/76877
See application file for complete search history.

(56) References Cited

U.S. PATENT DOCUMENTS

| 7,015,110 B2* | 3/2006 | Ning | H01L 23/5223 257/E21.019 |
|---|---|---|---|
| 8,749,058 B2* | 6/2014 | Usami | H01L 23/5226 257/639 |
| 9,653,356 B2* | 5/2017 | Park | H01L 21/76897 |
| 2006/0205204 A1* | 9/2006 | Beck | H01L 21/7684 438/628 |
| 2016/0247805 A1* | 8/2016 | Basker | H01L 21/823814 |

* cited by examiner

*Primary Examiner* — Alonzo Chambliss
(74) *Attorney, Agent, or Firm* — Anthony Canale; Hoffman Warnick LLC (57) ABSTRACT

The disclosure relates to a method of forming a Co contact module, the method including depositing a liner layer on a trench block, partially plating the lined trenches with Co as a first metal such that the resulting Co layer has a top surface below an opening top surface of a shallowest trench, depositing a second metal on the Co layer and exposed surfaces of the liner layer, planarizing the second metal layer, and etching the second metal layer and portions of the liner layer. The disclosure also relates to a Co contact module formed by the noted method.

20 Claims, 11 Drawing Sheets

METHOD OF FORMING COBALT CONTACT MODULE AND COBALT CONTACT MODULE FORMED THEREBY

TECHNICAL FIELD

The subject matter disclosed herein relates to cobalt contact modules of semiconductors. More specifically, various aspects described herein relate to a method of forming a cobalt contact module and the cobalt contact module formed thereby.

BACKGROUND

The semiconductor industry has experienced rapid growth. Technological advances in semiconductor materials and design have produced generations of semiconductors where each generation has smaller and more complex circuits than the previous generation. In the course of semiconductor evolution, functional density (i.e., the number of interconnected devices per chip area) has generally increased while geometry size (i.e., the smallest component or line that can be created using a fabrication process) has decreased. This scaling down process generally produces a relatively high rate of power loss, thus there has been a desire to use a high dielectric constant (high-k) gate dielectrics and metal gate electrodes to improve device performance as feature sizes continue to decrease. In some arrangements of metal integration, patterns etched into a dielectric are filled with metal layers by blanket deposition onto the wafer surface, for example by chemical vapor deposition (CVD).

Chemical mechanical polishing (CMP) has become a key technology driver to achieve local or global wafer planarization for submicron advanced semiconductors. The CMP process is used to planarize and remove excess metal, for example cobalt (Co), over the dielectric and to produce a planar semiconductor structure wherein metal lines or plugs, barrier metal, and exposed dielectric surfaces are coplanar. However, in instances where the semiconductor structure includes a step height between a trench silicide (TS) area and a non-TS area, and where Co is deposited as the metal layer, traditional CMP results in a Co residue remaining on the lower height non-TS area which in turn causes a zero yield in the non-TS area.

BRIEF SUMMARY

Methods of forming a Co contact module and the cobalt contact module formed thereby are disclosed. In a first aspect of the disclosure, a method of forming a Co contact module includes: depositing a liner layer on a trench block, such that the liner layer is deposited over a top surface of the trench block and on sidewalls and bottom portions of trenches of the trench block; partially plating the trenches with Co as a first metal, such that a Co layer is formed within the trenches and a top surface of the Co layer is below an opening top surface of a shallowest trench; depositing a second metal, such that a second metal layer is formed over the Co layer and exposed surfaces of the liner layer and a top surface of the second metal layer is above an opening top surface of a deepest trench; planarizing the second metal layer, such that the top surface of the second metal layer becomes approximately coplanar with the opening top surface of the deepest trench; and etching the second metal layer and portions of the liner layer, such that a top surface of the etched second metal layer is approximately coplanar with the opening top surface of the shallowest trench.

A second aspect of the disclosure includes a Co contact module including: a trench block having trenches; a liner layer on sidewalls and bottom portions of the trenches, the liner layer being present on the sidewalls no higher than an opening top surface of a shallowest trench; a Co layer within the lined trenches, the Co layer having a top surface below the opening top surface of the shallowest trench; and a second metal layer on the Co layer, the second metal layer having a top surface approximately coplanar with the opening top surface of the shallowest trench.

BRIEF DESCRIPTION OF THE DRAWINGS

These and other features of this invention will be more readily understood from the following detailed description of the various aspects of the invention taken in conjunction with the accompanying drawings that depict various embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

The subject matter disclosed herein relates to cobalt contact modules of semiconductors. More specifically, various aspects described herein relate to a method of forming a cobalt contact module and the cobalt contact module formed thereby.

As noted above, conventional CMP techniques used to planarize and remove excess metal, for example cobalt (Co), from semiconductor structures including a step height between gates, for example between a trench silicide (TS) area and a non-TS area, typically result in a Co residue remaining on the lower height non-TS area which in turn causes a detrimental zero yield in the non-TS area.

Figure 1A:
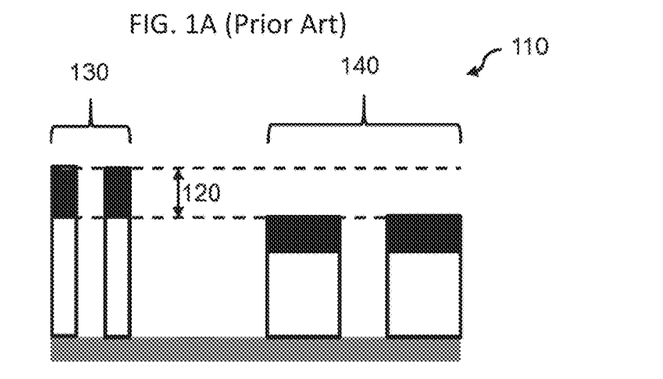
FIG. 1A (prior art) depicts a trench block with an approximately 35 nm step height between gates.
Figure 1B:
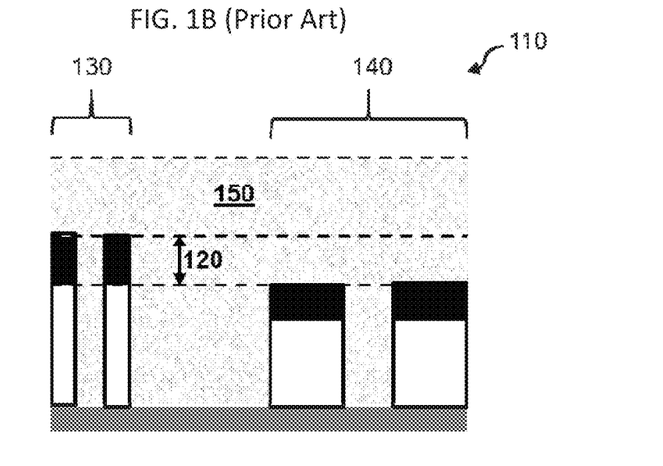
FIG. 1B (prior art) depicts conventional Co plating of the trench block of FIG. 1A.
Figure 1C:
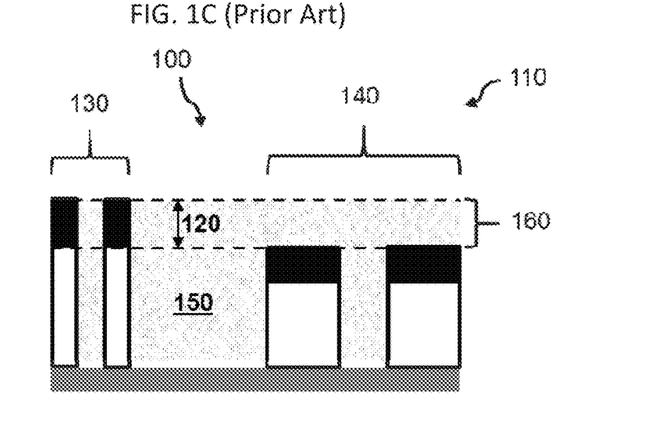
FIG. 1C (prior art) depicts conventional planarizing of the Co plated trench block of FIG. 1B, wherein there remains a Co residue on top of the lower gates having a thickness approximately equal to the 35 nm step height.

FIGS. 1A-1C (prior art) depict the conventional methods of forming a Co contact module 100 (FIG. 1C) of a semiconductor. FIG. 1A shows a trench block 110 with an approximately 35 nm step height 120 between gates 130/140. FIG. 1B shows conventional Co plating 150 of trench block 110. FIG. 1C shows conventional planarizing of the Co plated trench block wherein there remains a Co residue 160 on top of the lower gates 140 having a thickness approximately equal to the 35 nm step height 120.

In contrast to the conventional methods, various aspects of the disclosure include a method of forming a Co contact module, the method including depositing a liner layer on a trench block, partially plating the lined trenches of the trench block with Co as a first metal such that the Co layer has a top surface below an opening top surface of a shallowest trench, depositing a second metal on the Co layer and exposed surfaces of the liner layer, planarizing the second metal layer, and etching the second metal layer and portions of the liner layer.

The partial Co plating of the disclosure, as opposed to the conventional full Co plating, does not produce Co residue on top of the lower gates. When Co residue is present on top of the lower gates, the Co is not able to be adequately etched and results in a zero yield at the lower gates.

The second metal layer of the disclosure, for example tungsten (W) or copper (Cu), is deposited on the Co layer and is present on top of the lower gates before planarizing. When the second metal (e.g., W or Cu) is present on top of the lower gates, the second metal and portions of the liner layer are easily etched such that the top surface of the etched second metal layer is approximately coplanar with the opening top surface of the shallowest trench.

The partial Co plating and second metal deposition of the disclosure eliminates the stated problem of the prior art, namely zero yield at the lower gates. Furthermore, since Co, W and Cu have similar electrical conductivities and resistivities, the Co contact module produced according to the disclosure is stable and maintains satisfactory conductivity and resistivity levels.

Figure 2A:
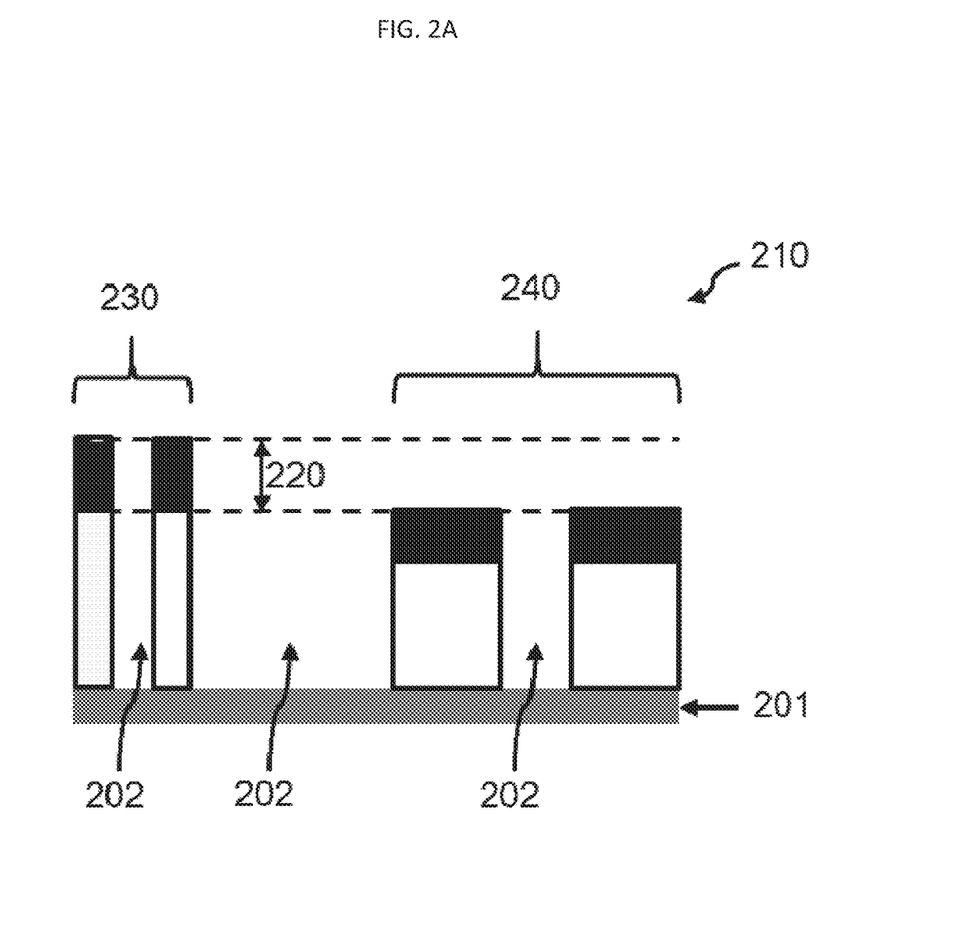
FIG. 2A depicts a trench block with an approximately 35 nm step height between gates.

FIGS. 2A-2F illustrate steps of a process in forming a cobalt contact module according to various embodiments of the disclosure. FIG. 2A shows a trench block 210 with a step height 220 between upper gates 230 in a trench silicide (TS) area and lower gates 240 in a non-TS area, the gates 230/240 being formed on substrate 201 with trenches 202 therebetween. It is understood that substrate 201 can include any conventional substrate materials, e.g., silicon, germanium, silicon germanium, silicon carbide, etc. Upper gates 230 and lower gates 240 can be any gate electrode, including high-k metal gates. Step height 220 can be 30 nanometers (nm) or more, or within the range of 30 nm to 40 nm, or approximately 35 nm.

Figure 2B:
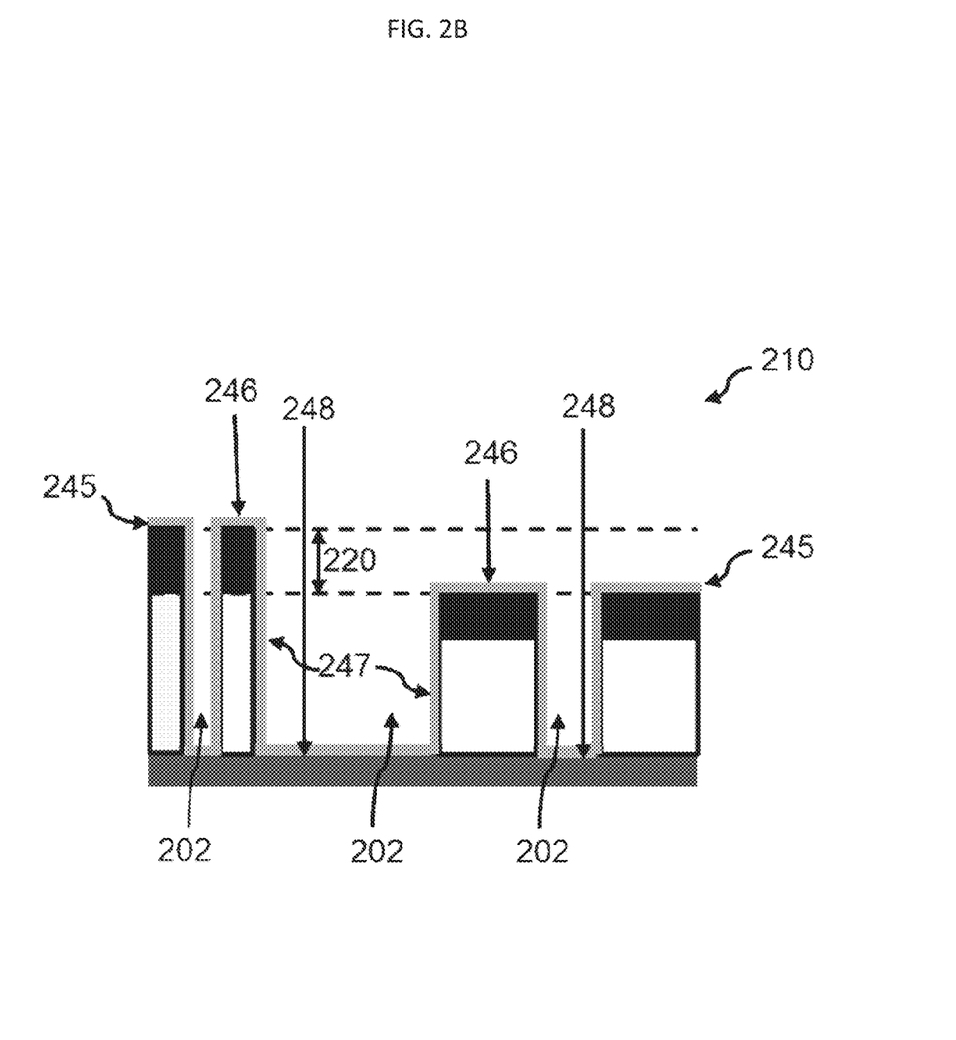
FIG. 2B depicts liner deposition on the trench block of FIG. 2A.

FIG. 2B shows the deposition of a liner layer 245 on trench block 210. The liner layer 245 is deposited such that liner layer 245 forms over a top surface 246 and on sidewalls 247 and bottom portions 248 of trenches 202 of trench block 210. Liner layer 245 may contain Co, Ta, TaN, Ti, TiN, Ru or combinations thereof. Liner layer 245 may be deposited via any now known or later developed techniques appropriate for the material to be deposited as noted below. Liner layer 245 is preferably deposited via chemical vapor deposition (CVD).

As used herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2C:
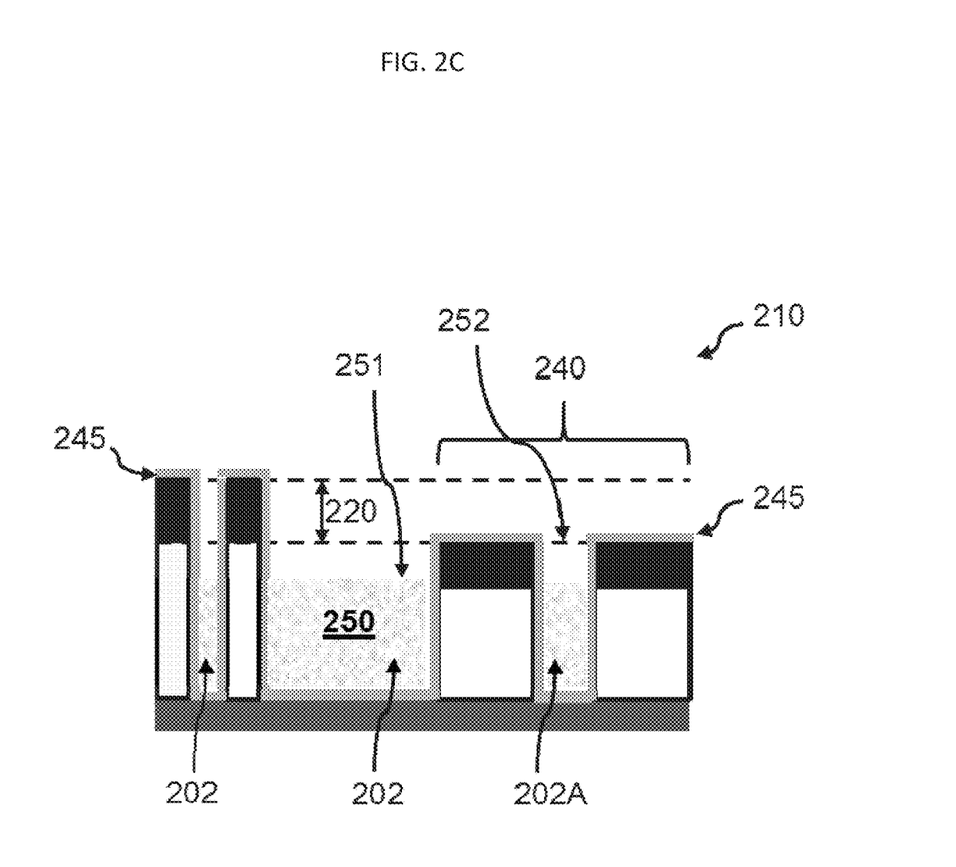
FIG. 2C depicts partial Co plating of the trench block of FIG. 2B.
Figure 3:
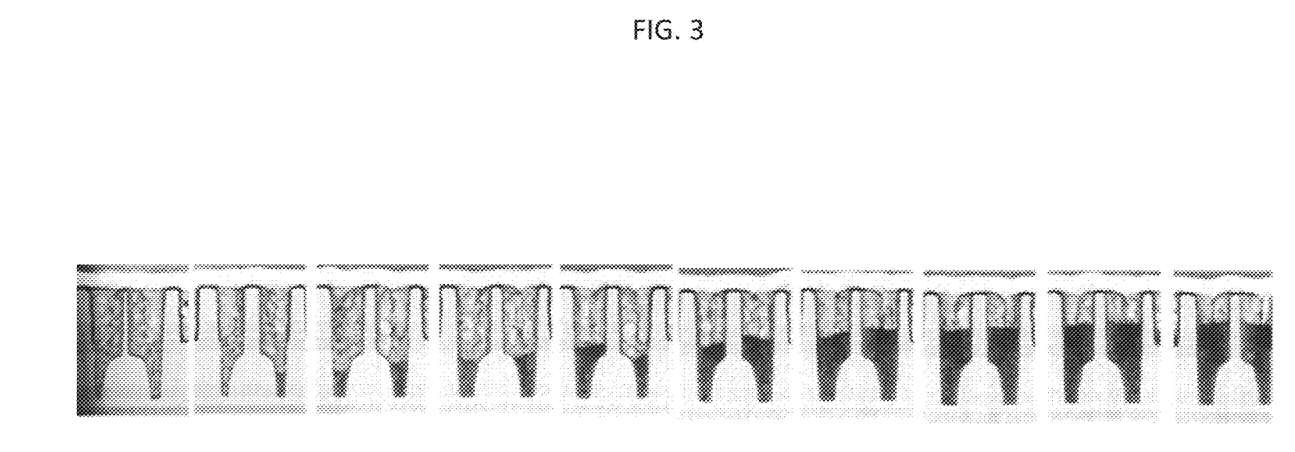
FIG. 3 is a reproduction of progressive transmission electron microscope (TEM) images (from left to right) as relates to the progression from the configuration of FIG. 2A to FIG. 2B to FIG. 2C.

FIG. 2C shows partial Co plating of trench block 210 to form Co layer 250. Co layer 250 is formed within trenches 202 and has a top surface 251 below an opening top surface 252 of a shallowest trench 202A. Due to the top surface 251 of Co layer 250 being below opening top surface 252, Co residue is not substantially produced on top of lower gates 240. FIG. 3 shows a TEM image of the Co partial plating progression from FIG. 2A (left) to FIG. 2C (right).

As can be seen from FIG. 3, the partial Co plating fills the trenches from the bottom up. Such bottom-up growth is the result of the plating rate at the bottom on the trenches being higher than the plating rate above the opening top surfaces of the trenches, a chamfer area of the trenches and the trench sidewall area near the chamfer area. This difference in plating rates is due to the use of a cobalt plating bath containing, among other things, one or more suppressors. The suppressors are any long molecules suitable for the purpose of suppressing. An example suppressor is polyethylene glycol having a molecular weight of 3400 or more. Other components that may be present in the plating bath include $CoSO_4$, boric acid and/or $H_2SO_4$.

The suppressors absorb on the top surfaces of the trench block as well as on the chamfer areas of the trenches and the trench sidewall areas near the chamfer area. Thus, the plating overpotential in these areas (top surfaces, chamfers, sidewalls near chamfers) increases and receives minimal plating as compared to the lower plating overpotential at the bottom of the trenches. Minimal plating refers to plating of approximately 2 to 6%. Such minimal plating does not interfere with the yield of the lower gates discussed above.

Figure 2D:
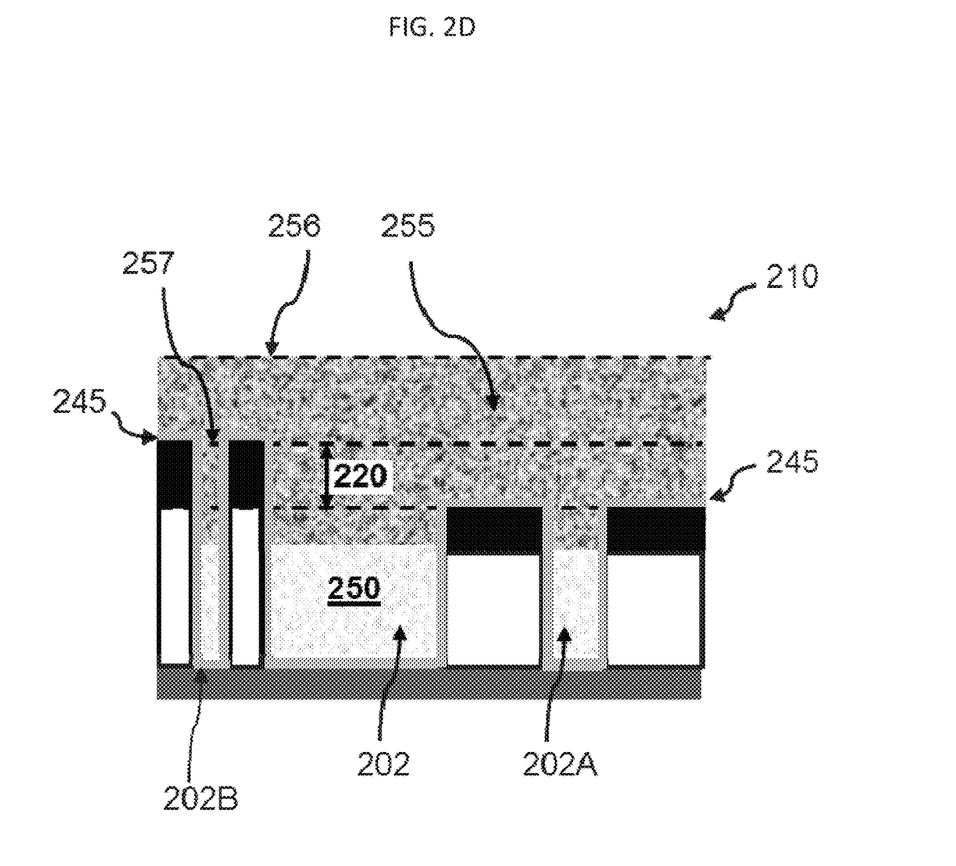
FIG. 2D depicts deposition of a second metal on the trench block of FIG. 2C.

FIG. 2D shows deposition of a second metal on trench block 210. Second metal layer 255 is formed over the partially plated Co layer 250 and exposed portions of liner layer 245. Second metal layer 255 has a top surface 256 above an opening top surface 257 of a deepest trench 202B. The second metal is tungsten or copper. Second metal layer 255 may be deposited via any now known or later developed techniques appropriate for the material to be deposited as noted above. Second metal layer 255 is preferably deposited via physical vapor deposition (PVD).

Figure 2E:
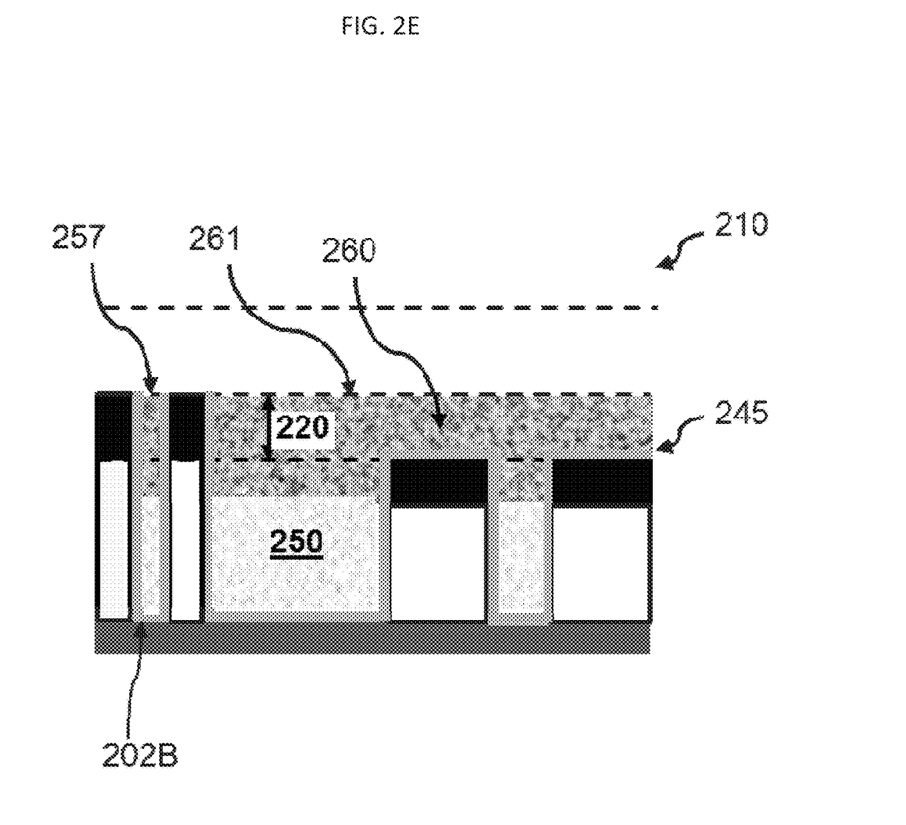
FIG. 2E depicts planarizing of the trench block of FIG. 2D.

FIG. 2E shows planarizing of the second metal layer on trench block 210. Planarized second metal layer 260 is formed and has a top surface 261 approximately coplanar with opening top surface 257 of deepest trench 202B. The planarized second metal layer 260 may be planarized via any now known or later developed techniques appropriate for the material to be planarized as noted below. Planarized second metal layer 260 is preferably planarized via chemical mechanical planarizing (CMP).

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than a wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Figure 2F:
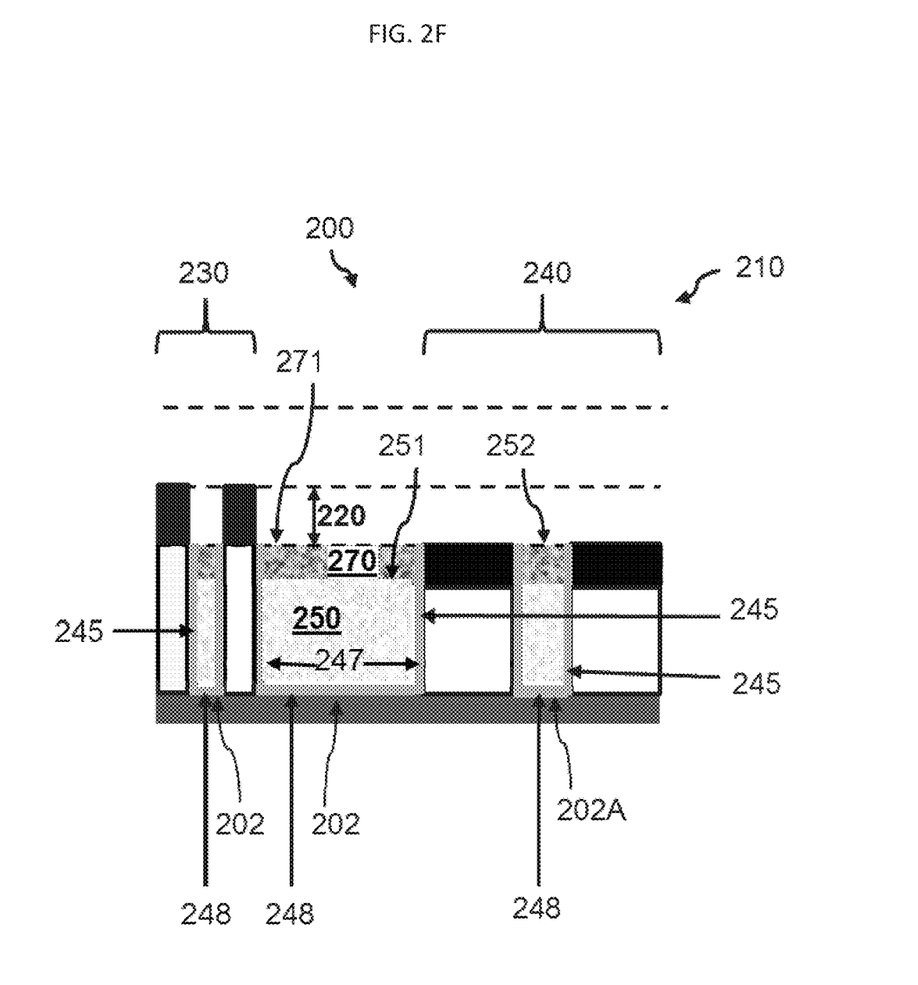
FIG. 2F depicts etching of the trench block of FIG. 2E, wherein there remains no Co residue and no liner layer on top of the lower gates.

FIG. 2F shows etching of the planarized second metal layer and exposed portions of the liner layer. Etched second metal layer 270 is formed and has a top surface 271 approximately coplanar with opening top surface 252 of shallowest trench 202A. The etched second metal layer 270 may be etched via any now known or later developed techniques appropriate for the material to be etched. Etched second metal layer 270 is preferably etched via non-selective reaction ion etching (RIE). The etching of the second metal layer and exposed portions of the liner layer is performed such that the portions of the liner layer 245 that are removed via the etching are portions located on the top surfaces of trench block 210 and on the sidewalls of trench portions located above top surface 271 of etched second metal layer 270. The etching does not etch gates 230/240 due to masking of the gates.

Upon completion of the noted etching, there remains no Co residue, no second metal residue and no liner layer on top of lower gates 240. Therefore, as noted above, the Co contact module produced according to the disclosure eliminates the stated problem of the prior art, namely zero yield at the lower gates, and does so while still maintaining stability of the Co/second metal composition and satisfactory conductivity and resistivity levels.

Figure 4:
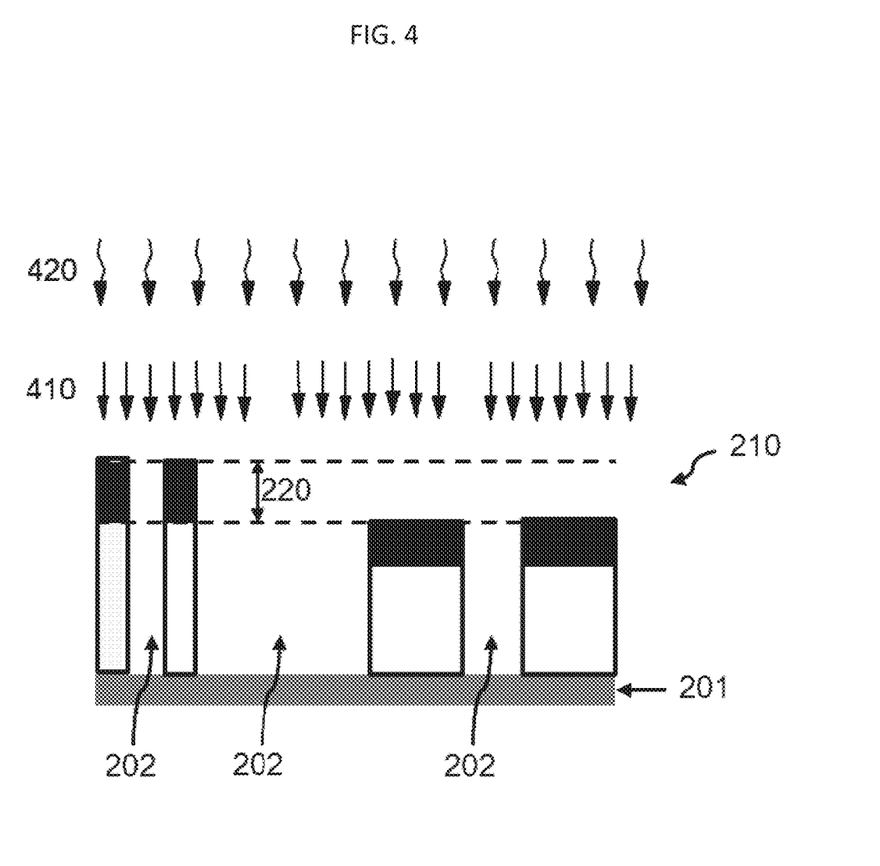
FIG. 4 depicts optional deposition of titanium or titanium nitride followed by dynamic surface anneal (DSA), performed before the deposition of FIG. 2B.

In addition to the method steps discussed above, the method of the disclosure can also include, before the depositing of liner layer 245, deposition of titanium or titanium nitride 410, followed by dynamic surface anneal (DSA) 420 (see FIG. 4). The titanium and titanium nitride may be deposited via any now known or later developed techniques appropriate for the material to be deposited as noted above. Titanium is preferably deposited via radio frequency physical vapor deposition (RFPVD). Titanium nitride is preferably deposited via atom layer deposition (ALD).

Figure 5:
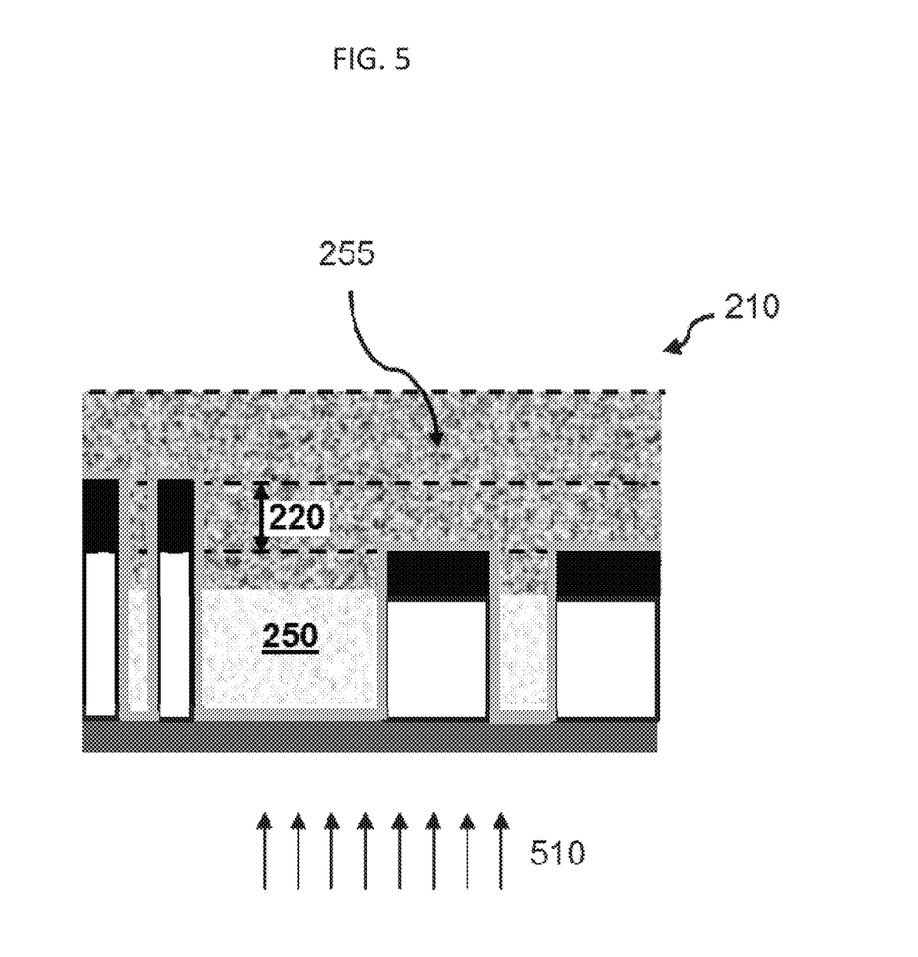
FIG. 5 depicts optional back-side and bevel cleaning, performed after the deposition of FIG. 2D and before the planarization of FIG. 2E.

Also, the method of the disclosure can further include, between the depositing of the second metal and the planarizing of second metal layer 255, back-side and bevel cleaning 510 (see FIG. 5).

Figure 6:
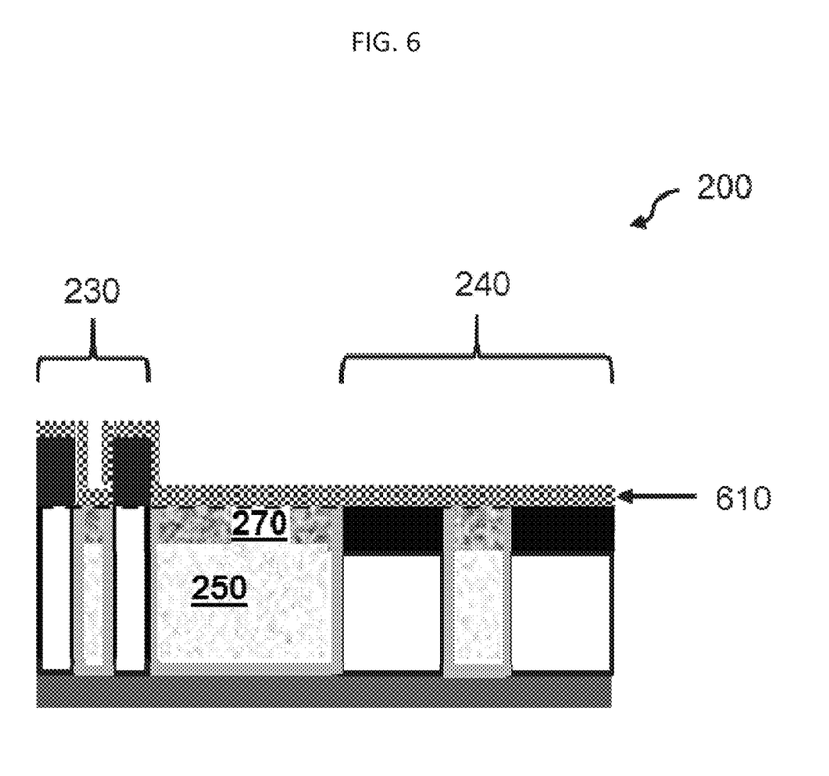
FIG. 6 depicts optional formation of a cap layer, performed after the etching of FIG. 2F.

Additionally, the method of the disclosure can further include, after the etching of the second metal layer and portions of the liner layer, formation of a cap layer 610 over the second metal layer 270 and exposed surfaces of gates 230/240 (see FIG. 6). The cap layer can contain SiN, SiC, SiCN or combinations thereof.

While the aspects of the disclosure described above relate to a method of forming a cobalt contact module, the below discussed aspects relate to a cobalt contact module formed thereby.

FIG. 2F depicts a Co contact module 200 including trench block 210 containing trenches 202; liner layer 245 on sidewalls 247 and bottom portions 248 of trenches 202, liner layer 245 being present on sidewalls 247 no higher than height 252 of shallowest trench 202A; Co layer 250 within the lined trenches, Co layer 250 having height 251 less than height 252 of shallowest trench 202A; and planarized and etched second metal layer 270 on Co layer 250, second metal layer 270 having height 271 approximately equal to height 252 of shallowest trench 202A.

The second metal of the Co contact module of the disclosure can be tungsten or copper. The liner layer of the Co contact module of the disclosure can contain Co, Ta, TaN, Ti, TiN, Ru or combinations thereof.

The trench block of the Co contact module of the disclosure has step height 220 between upper gates 230 in a trench silicide (TS) area and lower gates 240 in a non-TS area. Step height 220 can be approximately 30 nm or more, or within the range of 30 nm to 40 nm, or approximately 35 nm.

The Co contact module 200 of the disclosure can further include a cap layer 610 on the second metal layer 270 and exposed surfaces of gates 230/240 (see FIG. 6). The cap layer can contain SiN, SiC, SiCN or combinations thereof.

As noted above, the Co contact module of the disclosure includes no Co residue, no second metal residue and no liner layer on top of the lower gates, thus eliminating the stated problem of the prior art, namely zero yield at the lower gates. In addition, the Co contact module of the disclosure eliminates the stated problem of the art while still maintaining stability of the Co/second metal composition and satisfactory conductivity and resistivity levels.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method of forming a cobalt (Co) contact module, the method comprising:
    depositing a liner layer on a trench block, such that the liner layer is deposited over a top surface of the trench block and on sidewalls and bottom portions of trenches of the trench block;
    partially plating the trenches with Co as a first metal, such that a Co layer is formed within the trenches and a top surface of the Co layer is below an opening top surface of a shallowest trench;
    depositing a second metal, such that a second metal layer is formed over the Co layer and exposed surfaces of the liner layer and a top surface of the second metal layer is above an opening top surface of a deepest trench;
    planarizing the second metal layer, such that the top surface of the second metal layer becomes approximately coplanar with the opening top surface of the deepest trench; and
    etching the second metal layer and portions of the liner layer, such that a top surface of the etched second metal layer is approximately coplanar with the opening top surface of the shallowest trench.

2. The method of claim 1, wherein the second metal is tungsten.

3. The method of claim 1, wherein the second metal is copper.

4. The method of claim 1, wherein the liner layer comprises Co, Ta, TaN, Ti, TiN, Ru or combinations thereof.

5. The method of claim 1, wherein the etching of the second metal layer and portions of the liner layer is performed such that the portions of the liner layer that are removed are portions located on the top surfaces of the trench block and on the sidewalls of trench portions located above the top surface of the etched second metal layer.

6. The method of claim 1, wherein the trench block comprises a step height between a trench silicide (TS) area and a non-TS area.

7. The method of claim 6, wherein the step height is approximately 30 nanometers or more.

8. The method of claim 1, wherein the depositing of the liner layer is performed by chemical vapor deposition (CVD).

9. The method of claim 1, wherein the depositing of the second metal is performed by physical vapor deposition (PVD).

10. The method of claim 1, wherein the etching of the second metal layer and portions of the liner layer is performed by non-selective reactive ion etching (RIE).

11. The method of claim 1, further comprising, before the depositing of the liner layer:
    radio frequency physical vapor depositing (RFPVD) titanium or atomic layer depositing (ALD) titanium nitride, followed by
    dynamic surface annealing (DSA).

12. The method of claim 1, further comprising, between the depositing of the second metal and the planarizing of the second metal layer:
    back-side and bevel cleaning.

13. The method of claim 1, further comprising, after the etching of the second metal layer and portions of the liner layer:
    forming a cap layer over the second metal layer, wherein the cap layer comprises SiN, SiC, SiCN or combinations thereof.

14. A cobalt (Co) contact module comprising:
    a trench block comprising trenches;
    a liner layer on sidewalls and bottom portions of the trenches, the liner layer being present on the sidewalls no higher than an opening top surface of a shallowest trench;
    a Co layer within the lined trenches, the Co layer having a top surface below the opening top surface of the shallowest trench; and
    a planarized and etched second metal layer on the Co layer, the second metal layer having a top surface approximately coplanar with the opening top surface of the shallowest trench.

15. The module of claim 14, wherein the second metal is tungsten.

16. The module of claim 14, wherein the second metal is copper.

17. The module of claim 14, wherein the liner layer comprises Co, Ta, TaN, Ti, TiN, Ru or combinations thereof.

18. The module of claim 14, wherein the trench block has a step height between a trench silicide (TS) area and non-TS area.

19. The module of claim 18, wherein the step height is approximately 30 nanometers or more.

20. The module of claim 14, wherein the module further comprises a cap layer on the second metal layer, the cap layer comprising SiN, SiC, SiCN or combinations thereof.

* * * * *